(12) United States Patent
Cho et al.

(10) Patent No.: US 9,508,828 B2
(45) Date of Patent: Nov. 29, 2016

(54) ARRAY SUBSTRATE AND METHOD OF FABRICATING THE SAME

(71) Applicant: LG Display Co., Ltd., Seoul (KR)

(72) Inventors: Ki-Sul Cho, Gumi-si (KR); Jin-Chae Jeon, Dalseo-gu (KR)

(73) Assignee: LG Display Co., Ltd., Seoul (KR)

( * ) Notice: Subject to any disclaimer, the term of this patent is extended or adjusted under 35 U.S.C. 154(b) by 147 days.

(21) Appl. No.: 13/875,509

(22) Filed: May 2, 2013

(65) Prior Publication Data

US 2013/0292768 A1 Nov. 7, 2013

(30) Foreign Application Priority Data

May 4, 2012 (KR) .................. 10-2012-0047383

(51) Int. Cl.
*H01L 29/66* (2006.01)
*H01L 29/786* (2006.01)
*H01L 27/12* (2006.01)

(52) U.S. Cl.
CPC ..... *H01L 29/66742* (2013.01); *H01L 27/1225* (2013.01); *H01L 27/1288* (2013.01); *H01L 29/7869* (2013.01)

(58) Field of Classification Search
CPC ........... H01L 29/66742; H01L 29/786; H01L 29/7869; H01L 27/1225; H01L 27/1288
USPC ........................................ 257/347
See application file for complete search history.

(56) References Cited

U.S. PATENT DOCUMENTS

| 2008/0002125 A1* | 1/2008 | Kim ............................... 349/140 |
| 2010/0224880 A1* | 9/2010 | Kimura ........................... 257/59 |
| 2010/0289023 A1* | 11/2010 | Choi et al. ...................... 257/59 |
| 2012/0107983 A1* | 5/2012 | Choi ........................ H01L 21/77 438/34 |
| 2012/0138938 A1* | 6/2012 | Bae ..................... G02F 1/13439 257/59 |

FOREIGN PATENT DOCUMENTS

| CN | 101349844 A | 1/2009 |
| CN | 101887868 A | 11/2010 |
| CN | 101908537 A | 12/2010 |

OTHER PUBLICATIONS

"Doped ZnO Thin Films as Anode Materials for Organic Light-Emitting diodes", Thin Solid Films, 420-421 (2002) 539-543.*
"Deposition of Low Sheet Resistance Indium Tin Oxide Directly onto Functional Small Molecules", Thin Solid Films, 570 (2014) 129-133.*
Office Action issued in Chinese Patent Application No. 201310160654.6, mailed Dec. 23, 2014, 11 pages.

* cited by examiner

*Primary Examiner* — Bilkis Jahan
*Assistant Examiner* — Nga Doan
(74) *Attorney, Agent, or Firm* — Brinks Gilson & Lione

(57) ABSTRACT

A method of fabricating an array substrate includes forming a first metal layer, a gate insulating material layer and an oxide semiconductor material layer on a substrate; heat-treating the substrate having the oxide semiconductor material layer at a temperature of about 300 degrees Celsius to about 500 degrees Celsius; patterning the oxide semiconductor material layer, the gate insulating material layer and the first metal layer, thereby forming a gate electrode, a gate insulating layer and an oxide semiconductor layer; forming a gate line connected to the gate electrode and made of low resistance metal material; forming source and drain electrodes, a data line and a pixel electrode, the source and drain electrodes and the data line having a double-layered structure of a transparent conductive material layer and a low resistance metal material layer, the pixel electrode made of the transparent conductive material layer.

6 Claims, 12 Drawing Sheets

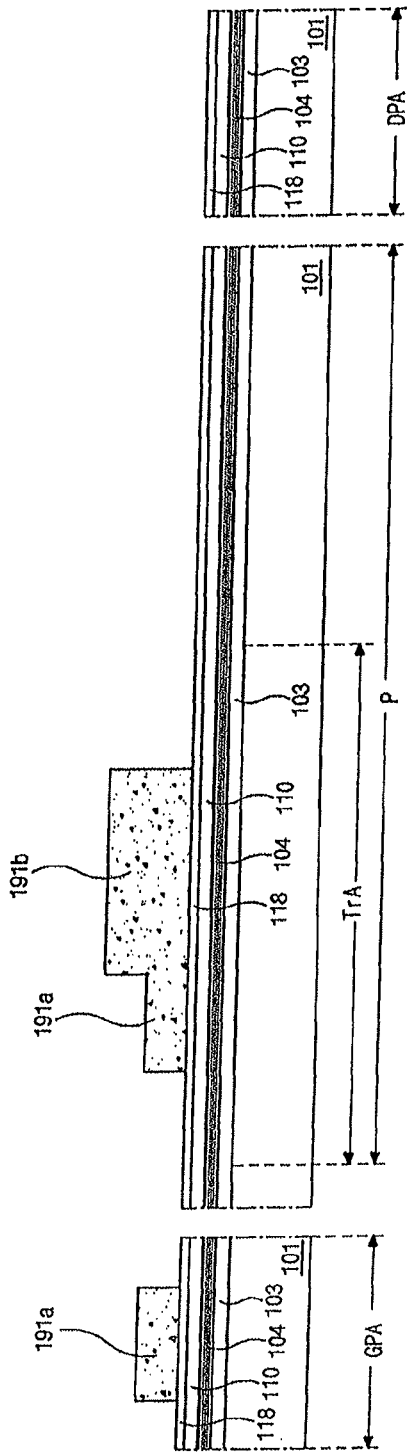
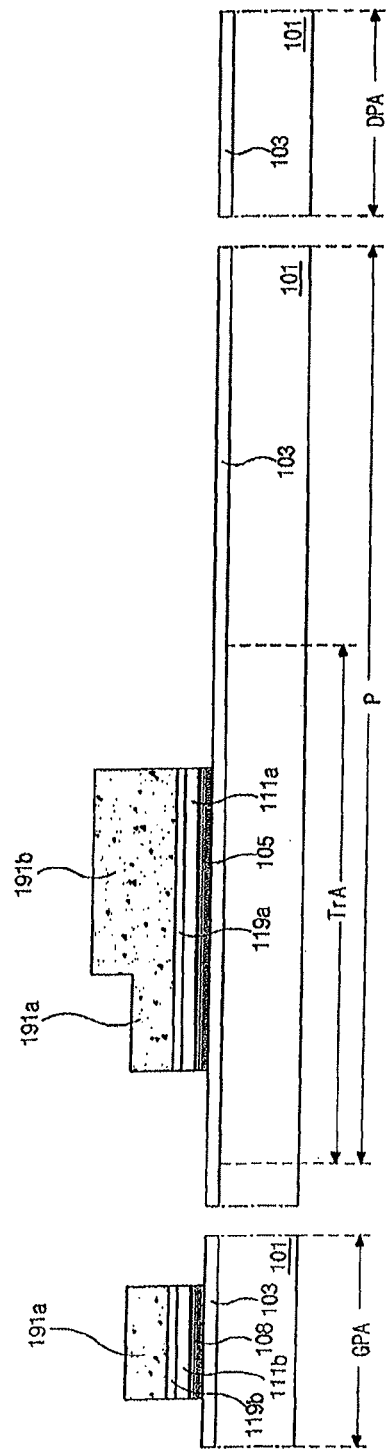

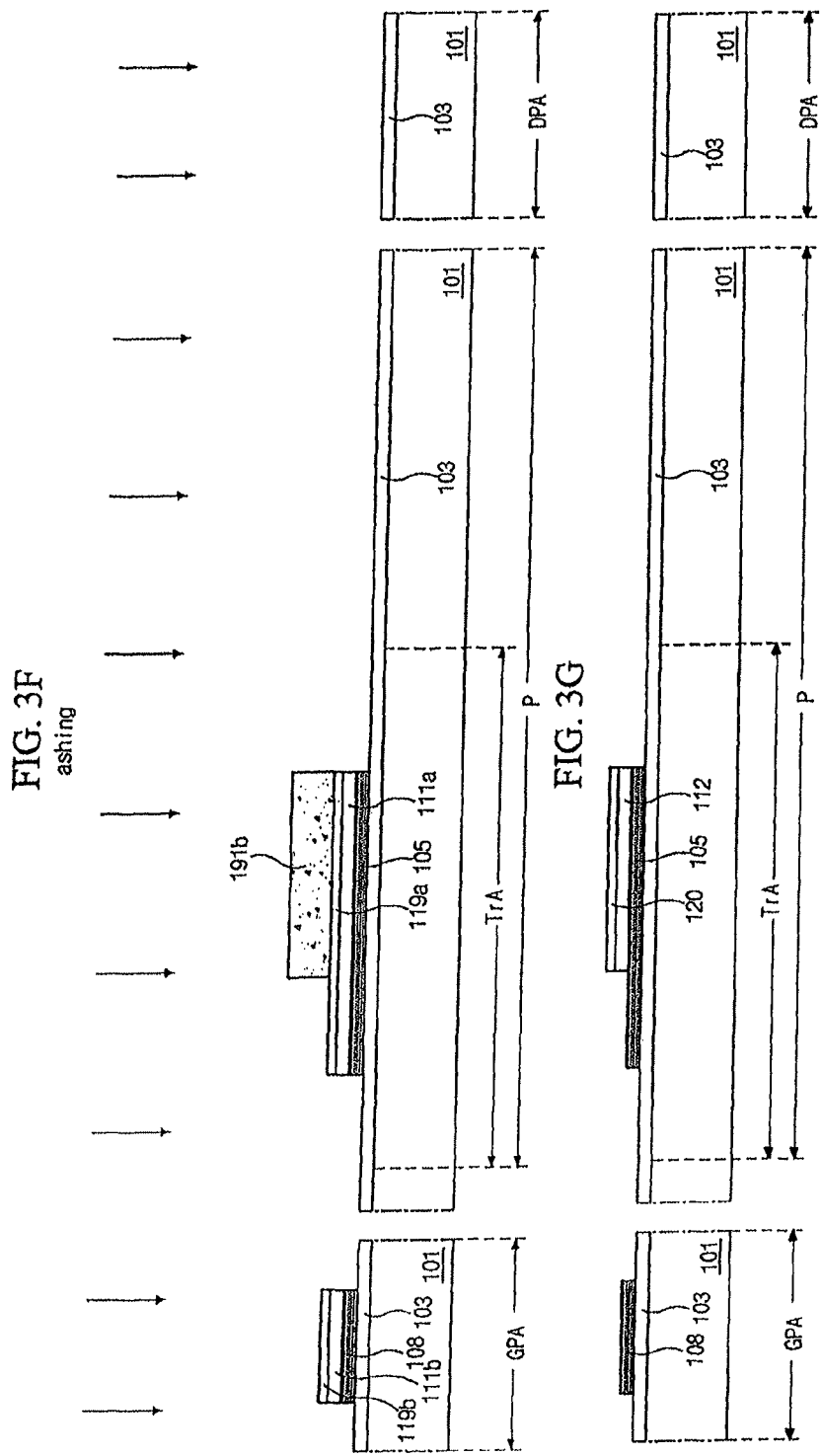

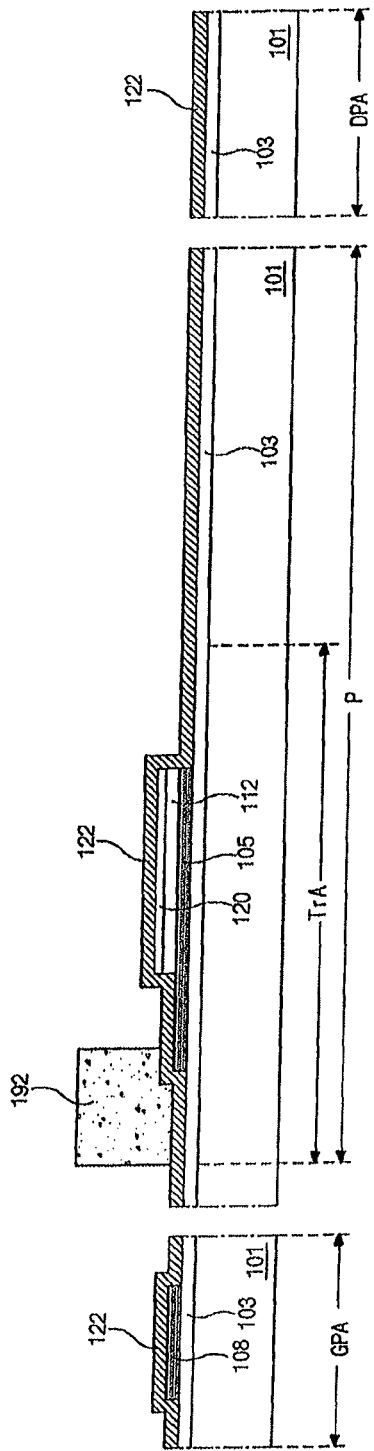
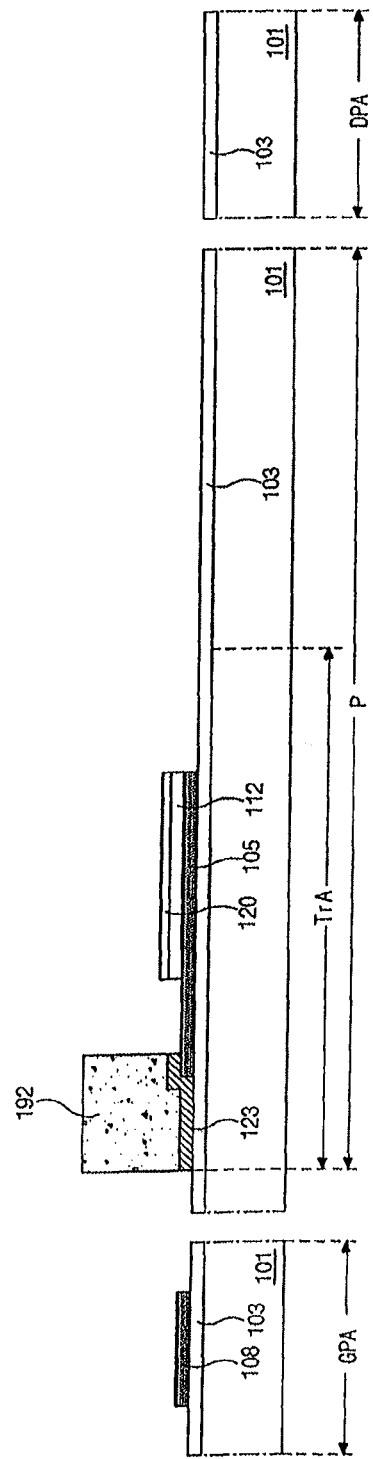

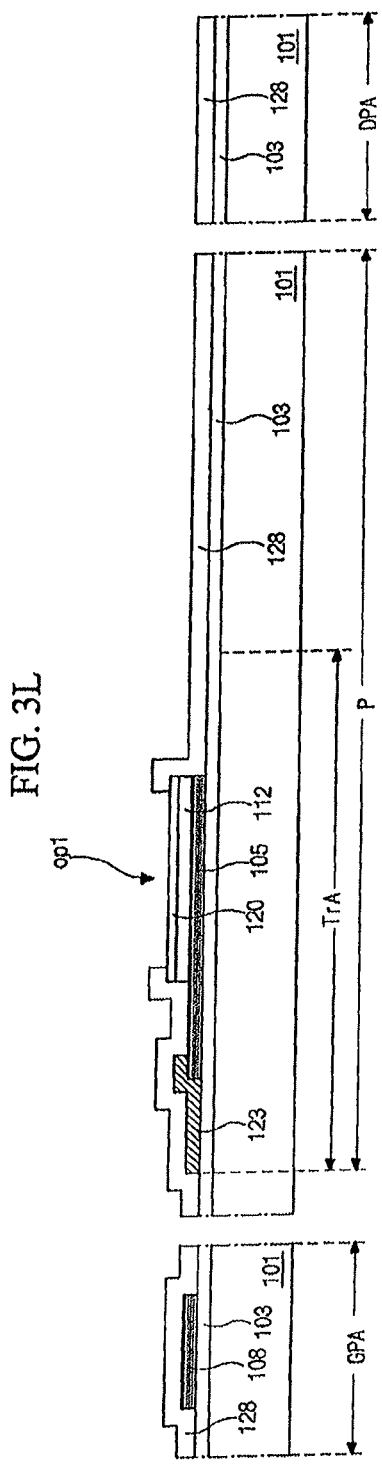

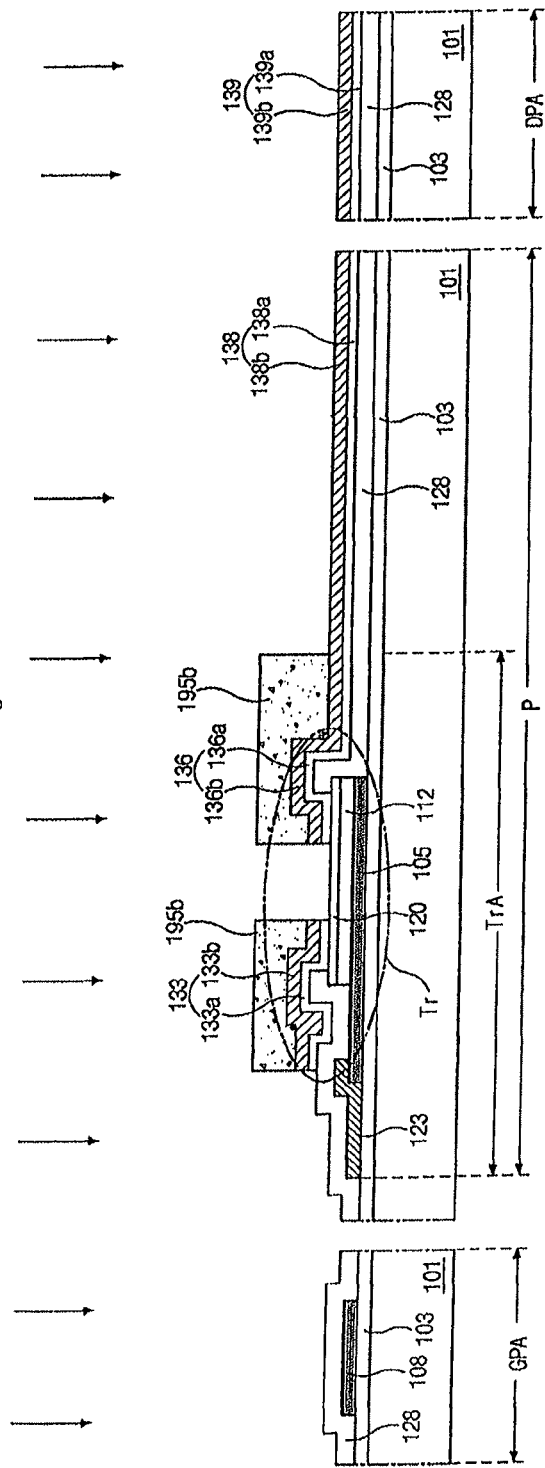

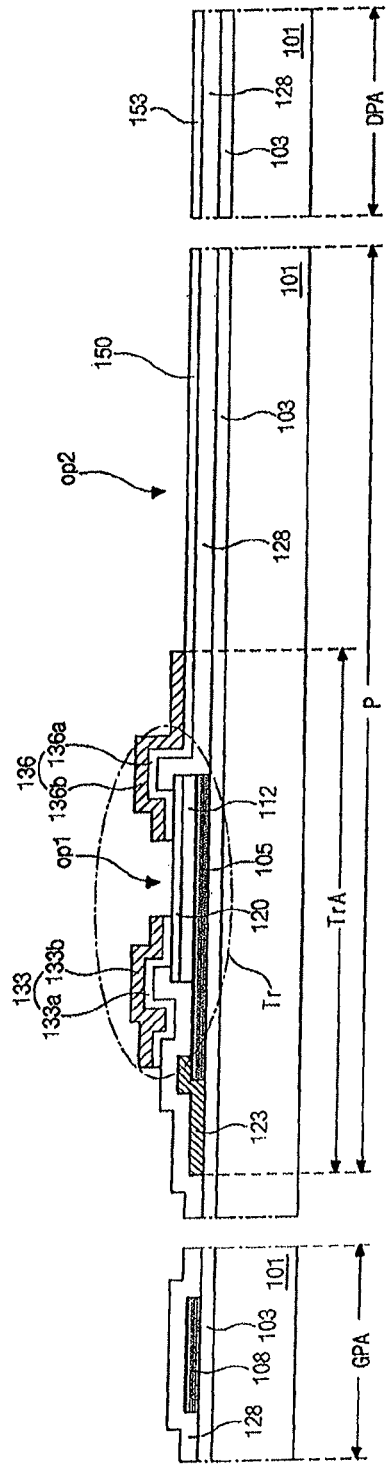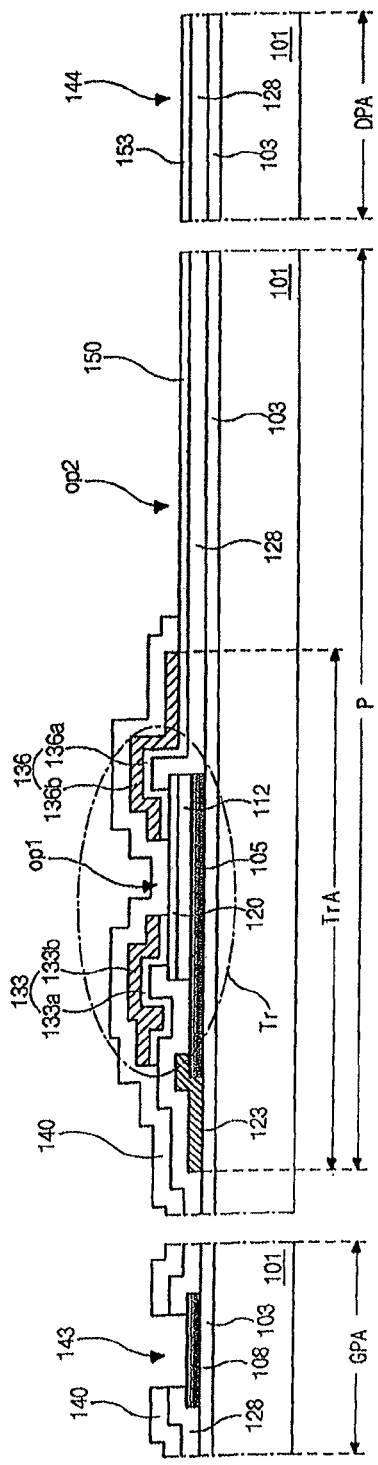

ARRAY SUBSTRATE AND METHOD OF FABRICATING THE SAME

The present invention claims the benefit of priority of Korean Patent Application No. 10-2012-0047383, filed in Korea on May 4, 2012, which is hereby incorporated by reference for all purposes as if fully set forth herein.

FIELD OF THE DISCLOSURE

The present disclosure relates to an array substrate, and more particularly, to an array substrate and a method of fabricating the same.

DISCUSSION OF THE RELATED ART

Recently, with the advent of an information-oriented society, the field of display devices configured to process and display a large amount of information has rapidly been developed. In particular, liquid crystal displays (LCDs) or organic light emitting diodes (OLEDs) have lately been developed as flat panel displays (FPDs) having excellent performance, such as a thinness, light weight, and low power consumption, and their use and development has superseded conventional cathode-ray tubes (CRTs).

Active matrix (AM)-type LCDs including an array substrate having a TFT serving as a switching element capable of controlling on/off voltages of each of pixels may have excellent resolution and capability of embodying moving images.

In addition, since an OLED is an emissive display having high luminance and low operating voltage characteristics, the OLED has a high contrast ratio and may be made very thin. Also, the OLED may be easily capable of embodying moving images due to a response time of several microseconds (μs), have an unlimited viewing angle, be stable at a low temperature, and operate at a low direct-current (DC) voltage of about 5 to 15V, thereby facilitating manufacture and design of driver circuits. For the above-described reasons, the OLED has lately attracted much attention as an FPD.

LCDs and OLEDs commonly require array substrates including thin-film transistors (TFTs) serving as switching elements to turn respective pixel regions on and off.

FIG. 1 is a cross-sectional view illustrating a pixel region including a thin film transistor in an array substrate of an LCD or an OLED according to the related art.

As shown in FIG. 1, a plurality of gate lines (not shown) and a plurality of data lines 33 cross each other on an array substrate 11 to define a plurality of pixel regions P. A gate electrode 15 is formed in a switching region TrA of each pixel region P. A gate insulating layer 18 is formed entirely on the gate electrode 15, and a semiconductor layer 28 including an active layer 22 of intrinsic amorphous silicon and an ohmic contact layer 26 of impurity-doped amorphous silicon is formed on the gate insulating layer 18.

A source electrode 36 and a drain electrode 38 are formed on the ohmic contact layer 26 corresponding to the gate electrode 15 and spaced apart from each other. The gate electrode 15, the gate insulating layer 18, the semiconductor layer 28, and the source and drain electrodes 36 and 38, which are sequentially stacked at the switching region TrA, forms a thin film transistor Tr.

Furthermore, a passivation layer 42 including a drain contact hole 45 and exposing the drain electrode 38 is formed entirely on the source and drain electrodes 36 and 38. A pixel electrode 50 is formed in each of pixel regions P on the passivation layer 42 and contacts the drain electrode 38 through the drain contact hole 45. A semiconductor pattern 29 is formed below the data line 33 and has a double-layered structure of first and second patterns 27 and 23, which are made of the same materials as the ohmic contact layer 26 and the active layer 22, respectively.

In the semiconductor layer 28 of the thin film transistor Tr formed in the switching region TrA, the active layer 22 has a first thickness t1 where the ohmic contact layer 26 is formed and has a second thickness t2 where the ohmic contact layer 26 is removed and exposed. This difference in thickness is caused by a fabrication method, and since the thickness is reduced at the portion exposed between the source and drain electrodes 36 and 38, property of the thin film transistor Tr is degraded.

To solve this problem, a thin film transistor shown in FIG. 2 has been developed, which does not need an ohmic contact layer and has a single-layered oxide semiconductor layer 79.

FIG. 2 is a cross-sectional view illustrating a pixel region of an array substrate including a thin film transistor having an oxide semiconductor layer according to the related art.

Referring to FIG. 2, a thin film transistor Tr includes a gate electrode 73 on a substrate 71, a gate insulating layer 75, an oxide semiconductor layer 79, source and drain electrodes 81 and 83, and an etch stopper 79. A passivation layer 85 is on the transistor Tr and has a drain contact hole 87 exposing the drain electrode 83. A pixel electrode 89 is on the passivation layer 85 and contacts the drain electrode 83 through the drain contact hole 87.

Since the ohmic contact layer is not needed, the oxide semiconductor layer 79 is not required to be exposed in a dry-etching, which is performed to form the ohmic contact layers of impurity-doped amorphous silicon spaced apart from each other, and degradation of property of thin film transistor Tr can be prevented.

Further, carrier mobility of the oxide semiconductor layer 79 is several times to ten times greater than that of the semiconductor layer using the amorphous silicon, and it is advantageous to a driving transistor.

However, the oxide semiconductor layer can have good mobility and reliability when it is heat-treated at a high temperature over 300 degrees Celsius during a predetermined time.

Recently, as a signal line is long with the large-sized display device, signal delay due to internal resistance of signal line is problematic. To solve this problem, a low resistance metal material, for example, copper (Cu), aluminum (Al), aluminum alloy (AlNd) or the like is used.

However, when a signal line or electrode formed using the low resistance metal material is exposed at a high temperature over 300 degrees Celsius, the signal line or electrode is deformed and is misaligned with post-formed components. Accordingly, the defect rate increases and the production rate is reduced.

SUMMARY

A method of fabricating an array substrate includes forming a first metal layer, a gate insulating material layer and an oxide semiconductor material layer sequentially on a substrate including a pixel region having a switching region; heat-treating the substrate having the oxide semiconductor material layer at a temperature of about 300 degrees Celsius to about 500 degrees Celsius; patterning the oxide semiconductor material layer, the gate insulating material layer and the first metal layer, thereby forming a gate electrode in a switching region having an island shape, and a gate insulating layer and an oxide semiconductor layer which are on the gate electrode, expose an end part of the gate electrode, and have an island shape; forming a gate line which overlaps the end part of the gate electrode, is at a boundary of the pixel region and is made of low resistance metal material; forming an inter-layered insulating film on the gate line and having a first opening that exposes a center portion of the oxide semiconductor layer; forming source and drain electrodes, a data line connected to the source electrode and crossing the gate line, and a pixel electrode in the pixel region on the inter-layered insulating film, wherein the source and drain electrodes have a double-layered structure of a lower layer made of transparent conductive material and an upper layer of low resistance metal material, contact the oxide semiconductor layer and are spaced apart from each other, wherein the pixel electrode is connected to the drain electrode and is made of the transparent conductive material; and forming a passivation layer on the pixel electrode and having a second opening exposing the pixel electrode.

In another aspect, an array substrate includes a gate electrode in a switching region of a pixel region on a substrate and having an island shape; a gate insulating layer and an oxide semiconductor layer which are located sequentially on the gate electrode, expose an end part of the gate electrode, and have the same plane area; a gate line contacting the gate electrode exposed outside the oxide semiconductor layer and formed on the substrate; an inter-layered insulating film on the gate line and having a first opening that exposes a center portion of the oxide semiconductor layer; source and drain electrodes and a data line on the on the inter-layered insulating film and having a double-layered structure of a lower layer made of transparent conductive material and an upper layer of low resistance metal material, wherein the data line crosses the gate line, wherein the source and drain electrodes contact the oxide semiconductor layer and are spaced apart from each other; a pixel electrode in the pixel region on the inter-layered insulating film and extending from the lower layer of the drain electrode; and a passivation layer on the pixel electrode and having a second opening exposing the pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
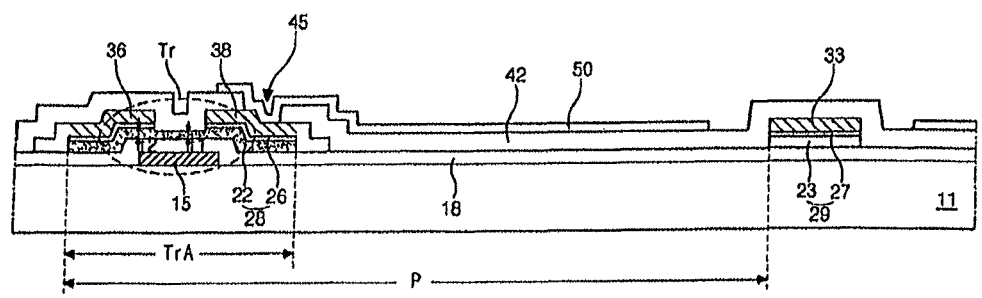
FIG. 1 is a cross-sectional view illustrating a pixel region including a thin film transistor in an array substrate of an LCD or an OLED according to the related art.
Figure 2:
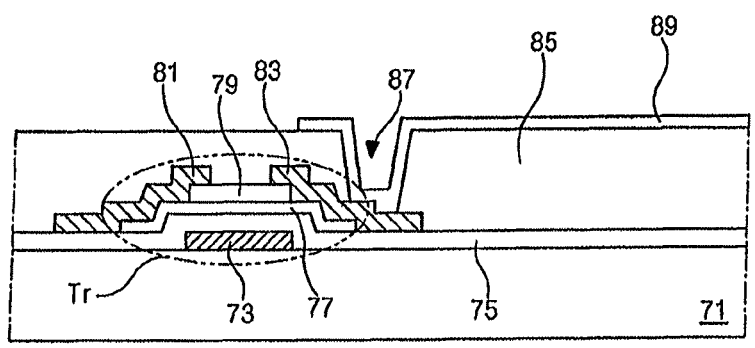
FIG. 2 is a cross-sectional view illustrating a pixel region of an array substrate including a thin film transistor having an oxide semiconductor layer according to the related art.
Figure 3A:
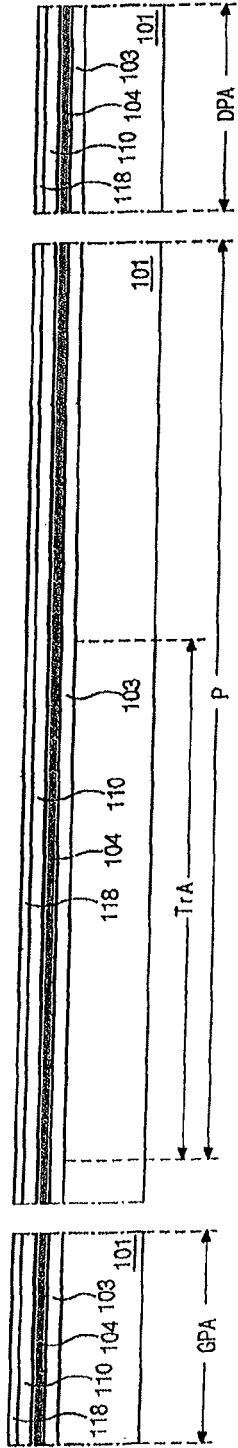
FIGS. 3A to 3Q are cross-sectional views illustrating a method of fabricating an array substrate including a thin film transistor using an oxide semiconductor layer according to an embodiment of the present invention.

FIGS. 3A to 3Q are cross-sectional views illustrating a method of fabricating an array substrate including a thin film transistor using an oxide semiconductor layer according to an embodiment of the present invention. A region where a thin film transistor Tr is formed in a pixel region P is defined as a switching region TrA.

Referring to FIG. 3A, a metal material, which has a melting temperature higher than a low resistance material and is hardly deformed at a temperature of 300 degrees Celsius to 500 degrees Celsius, for example, molybdenum (Mo), titanium (Ti), or molybdenum titanium (MoTi) is deposited on a transparent substrate 101 made of glass or plastic to form a first metal layer 104.

Prior to forming the first metal layer 104, an inorganic insulating material, for example, silicon oxide ($SiO_2$) or silicon nitride (SiNx) may be deposited on the substrate 101 to form a buffer layer 103.

The buffer layer 103 is for improving adhesion with a gate line made of a low resistance metal material that is formed in a post process. In particular, when the gate line is made of copper (Cu) or copper alloy, forming the buffer layer 103 is preferred to improve adhesion. When the gate line is made of aluminum or aluminum alloy other than copper or copper alloy, aluminum or aluminum alloy has good adhesion with the substrate 101 and the buffer layer 103 can be removed.

An inorganic insulating material, for example, silicon oxide ($SiO_2$) or silicon nitride (SiNx) is deposited on the first metal layer 104 to form a gate insulating material layer 110, and then an oxide semiconductor material, for example, indium gallium zinc oxide (IGZO), zinc tin oxide (ZTO) or zinc indium oxide (ZIO) is deposited to form an oxide semiconductor layer 118 on the gate insulating material layer 110.

Figure 3B:
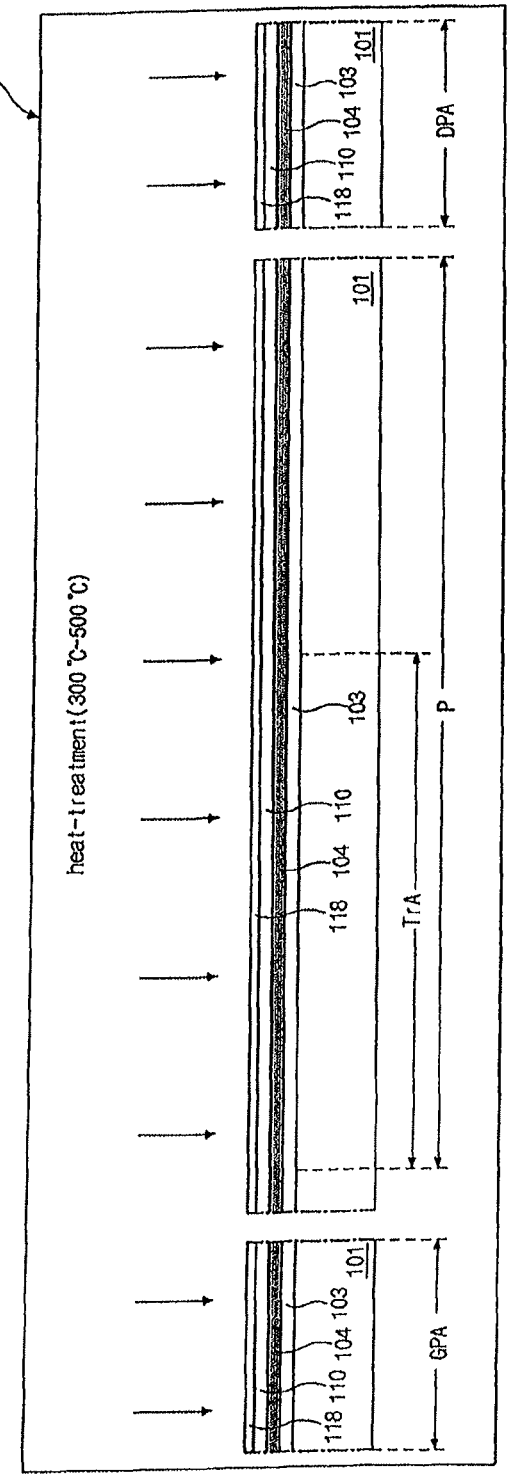

Referring to FIG. 3B, a substrate 101 having the oxide semiconductor layer 118 is placed in a heating apparatus 200, for example, an oven or furnace, and is heat-treated at a temperature of about 300 degrees Celsius to about 500 degrees Celsius for about 10 minutes to about 90 minutes.

Because of the heat-treatment, mobility of the oxide semiconductor layer 118 is improved. Further, even when the oxide semiconductor layer 118 is patterned, property difference of patterned oxide semiconductor at positions in a display region of the substrate 101 does not occur and high reliability can be obtained.

Even though the first metal layer 104 is exposed to a high temperature condition, the first metal layer 104 is made of molybdenum (Mo), titanium (Ti), or molybdenum titanium (MoTi) having a high melting point, and is not patterned and formed entirely on the substrate 101 in the heat-treatment step. Accordingly, deformation of the first metal layer 104 due to high temperature does not occur.

In case of the related art array substrate, the first metal layer of low resistance metal material is formed, then the first metal layer is patterned in a first mask process to form a gate line and a gate electrode, then a gate insulating material layer is formed, then an oxide semiconductor layer is formed, and then a heat-treatment is performed at a high temperature. Accordingly, the gate line and the gate electrode are very deformed and misaligned with post-formed components. However, according to the method of the embodiment, the first metal layer 104 made of not a low resistance metal material but a metal material having a high melting point and a gate insulating material layer 110 and an oxide semiconductor layer 118 on the first metal layer 104 are formed, and then a heat-treatment is performed at a high temperature before patterning the oxide semiconductor layer 118, the gate insulating material layer 110 and the first metal layer 104. Accordingly, reduction of production rate due to deformation of the gate line and the gate electrode in the related art can be prevented.

Figure 3C:
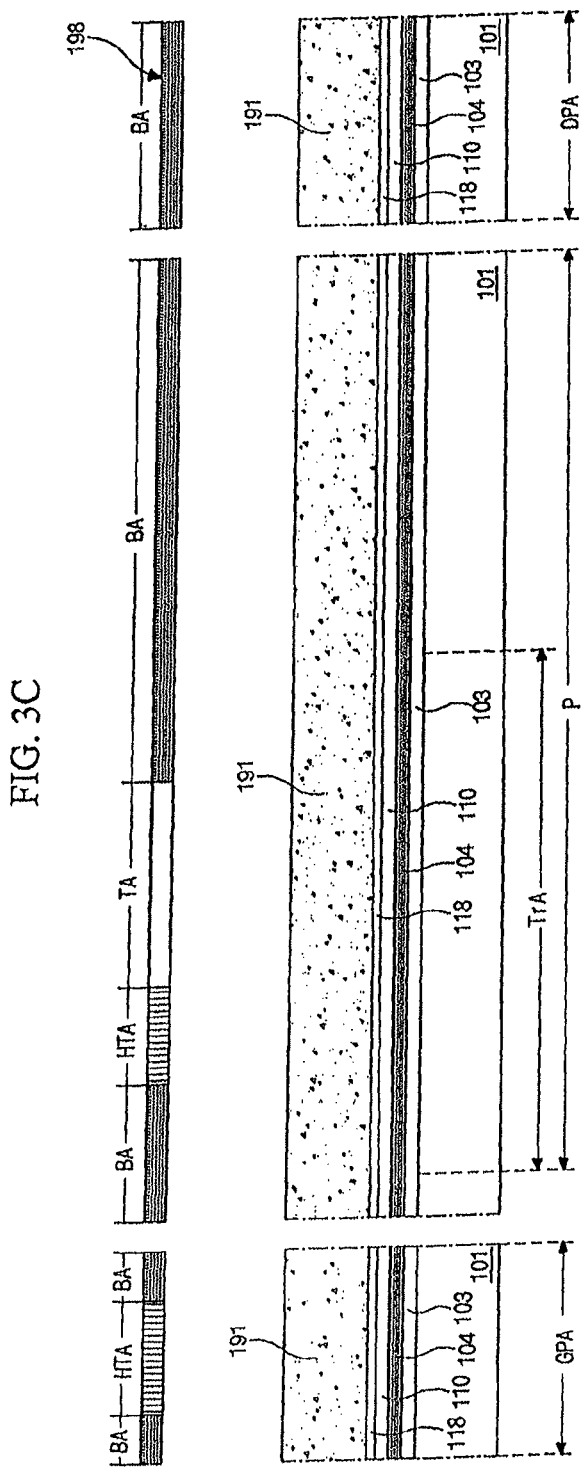

Referring to FIG. 3C, the heat-treated substrate 101 is coated with a photoresist on the oxide semiconductor layer 118 to form a first photoresist layer 191.

Then, a photo mask 198 including a transmissive region TA, a blocking region BA and a semi-transmissive region HTA is located over the first photoresist layer 191, and a light exposure is performed using the photo mask 198. The semi-transmissive region HTA is located corresponding to a portion, which does not overlap the oxide semiconductor layer (112 of FIG. 3G), in a region where a gate electrode (105 of FIG. 3E) is formed later, and corresponding to a gate pad portion GPA. The transmissive portion TA is located corresponding to a portion, which overlaps the oxide semiconductor layer (112 of FIG. 3G), in the region where the gate electrode (105 of FIG. 3E) is formed. The blocking region BA is located corresponding to regions other than regions corresponding to the transmissive region TA and the blocking region BA.

In this case, the first photoresist layer 191 is a negative type photoresist layer a portion of which exposed to light remains after developing. Alternatively, a positive type photoresist layer having a property opposite to the negative photoresist layer may be used. In case of using the positive type photoresist layer, a photo mask in which the blocking region BA and the transmissive region TA change positions is used.

Referring to FIG. 3D, the first photoresist layer 191 is developed to form a first photoresist pattern 191a having a first thickness and a second photoresist pattern 191b having a second thickness greater than the first thickness.

The first photoresist pattern 191a is formed corresponding to the portion, which does not overlap the oxide semiconductor layer (112 of FIG. 3G), in the region where the gate electrode (105 of FIG. 3E) is formed, and corresponding to the gate pad portion GPA. The second photoresist pattern 191b is formed corresponding to the portion, which overlaps the oxide semiconductor layer (112 of FIG. 3G), in the region where the gate electrode (105 of FIG. 3E) is formed. The photoresist layer 191 is removed at other regions to expose the oxide semiconductor layer 118.

Referring to FIG. 3E, the oxide semiconductor layer 118, the gate insulating material layer 110 and the first metal layer 104 exposed between the first and second photoresist patterns 191a and 191b are etched to form a gate electrode 105, a gate insulating pattern 111a and a semiconductor pattern 119a in the switching region TrA that have the same plane shape and are sequentially laminated.

In the same process, a gate pad electrode 108 is formed at the gate pad portion GPA. On the gate pad electrode 108, a first pattern 111b made of inorganic insulating material and a second pattern 119b made of oxide semiconductor material are formed.

Referring to FIG. 3F, an ashing is performed to remove the first photoresist pattern 191a having the first thickness is removed and to a part of the oxide semiconductor pattern 119a in the switching region TrA and the second pattern 119b in the gate pad portion GPA. The second photoresist pattern is reduced in thickness through the ashing process and remains on the oxide semiconductor layer 119a.

Referring to FIG. 3G, the oxide semiconductor layer 119a exposed by removal of the first photoresist pattern 191a and the gate insulating pattern 111a therebelow are etched to expose a part of the gate electrode 105 therebelow in the switching region TrA. In the same process, the first and second patterns 111a and 119b are removed to expose the gate pad electrode 108 in the gate pad portion GPA.

The oxide semiconductor pattern 119a and the gate insulating pattern 111a below the second photoresist pattern 191b become an island-shaped oxide semiconductor layer 120 and the gate insulating layer 112 having the same plane shape as the oxide semiconductor layer 120.

Then, a stripping is performed to remove the second photoresist pattern 191b to expose the oxide semiconductor layer 120 in the switching region TrA.

Referring to FIG. 3H, a low resistance metal material, for example, aluminum (Al), aluminum alloy (e.g., AlNd), copper (Cu), or copper alloy is deposited on the oxide semiconductor layer 120 to form a second metal layer 122.

Figure 3J:
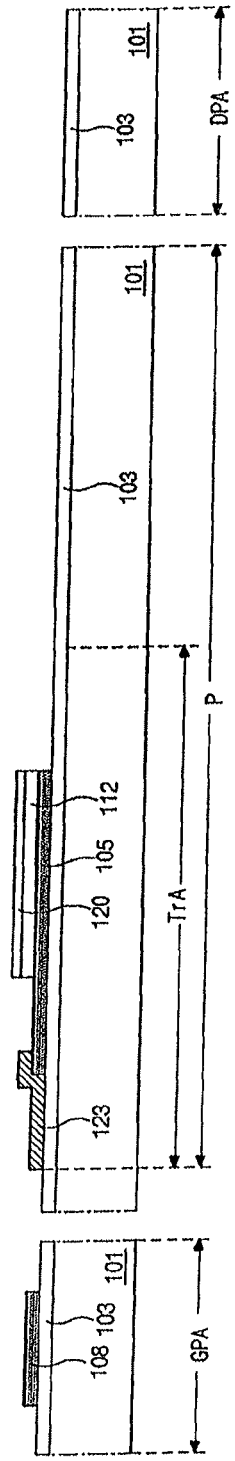

Then, the second metal layer 122 is coated with a photoresist to form a second photoresist layer (not shown). A light exposure and a developing are performed to form a third photoresist pattern 192, which corresponds to a boundary of the pixel region P, where a gate line (123 of FIG. 3J) is formed, including a part of a gate electrode 105 which is exposed outside the oxide semiconductor layer 112.

Referring to FIG. 3I, the second metal layer 122 is etched using the third photoresist pattern 192 to form the gate line 123, which extends along the boundary of the pixel region P and contacts the gate electrode 105 in the switching region TrA. The gate line 123 contacts the gate pad electrode 108 at an end thereof.

Since the gate line 123 is made of a low resistance metal material, for example, aluminum (Al), aluminum alloy (e.g., AlNd), copper (Cu), or copper alloy, signal delay can be prevented even when the substrate 101 is large. Further, since the gate line 123 is formed after the oxide semiconductor layer 120 is formed, the gate line 123 is not exposed to the heat-treatment for property improvement of the oxide semiconductor layer 120 and its deformation can be prevent.

Accordingly, misalignment with post-formed components can be prevented.

Referring to FIG. 3E, the third photoresist pattern 192 remaining on the gate line 123 is removed through a stripping process, and the gate line 123 is thus exposed.

Figure 3K:
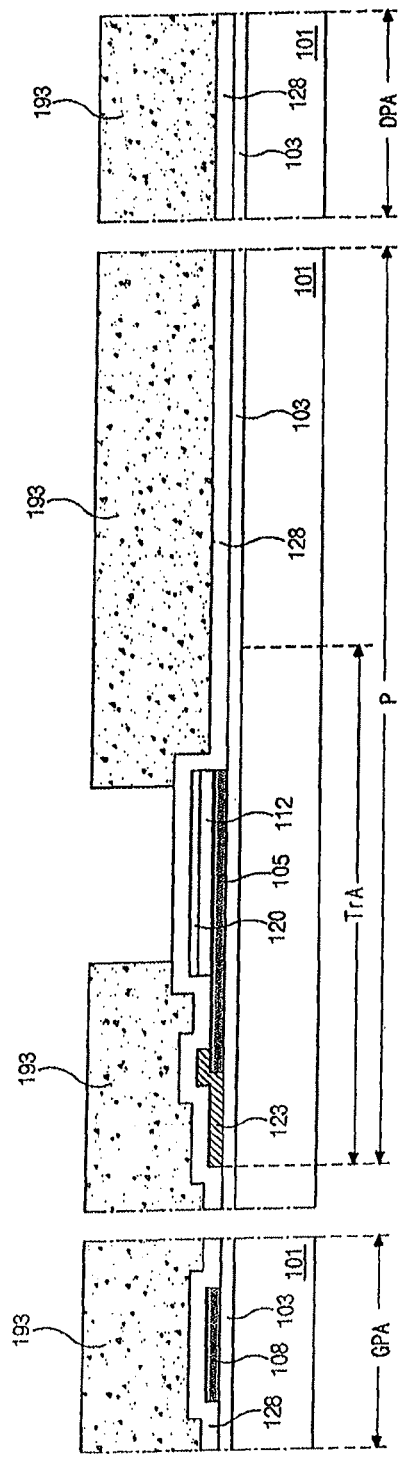

Referring to FIG. 3K, an inorganic insulating material, for example, silicon oxide ($SiO_2$) is deposited entirely on the gate line 123 to form an inter-layered insulating film 128.

Then, the inter-layered insulating film 128 is coated with a photoresist to form a third photoresist layer (not shown), and a light exposure and a developing is performed to form a fourth photoresist pattern 193 that exposes the inter-layered insulating film 128 over a center portion of the oxide semiconductor layer 120.

Then, referring to FIG. 3L, the inter-layered insulating film 128 is etched using the fourth photoresist pattern 193 to form a first opening op1 that exposes the center portion of the oxide semiconductor layer 120.

Then, the fourth photoresist pattern 193 is removed through a stripping, and the inter-layered insulating film 128 is thus exposed.

Figure 3M:
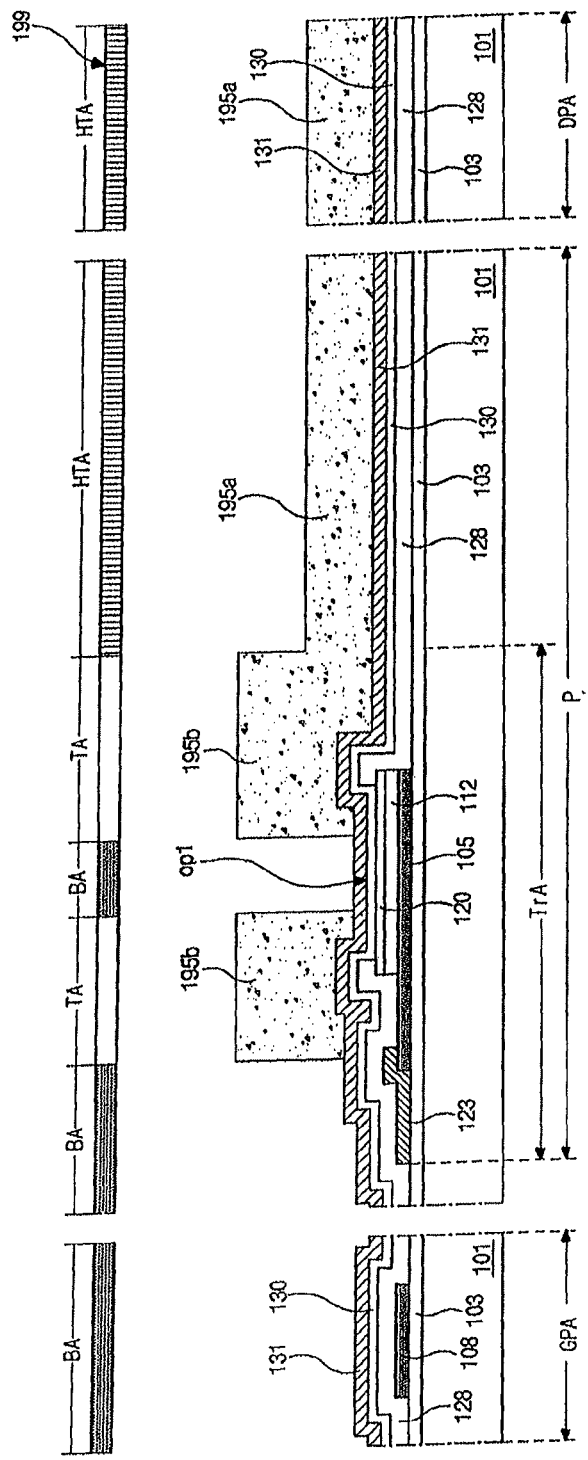

Referring to FIG. 3M, a transparent conductive material, for example, indium-tin-oxide (ITO) or indium-zinc-oxide (IZO), is deposited on the inter-layered insulating film 128 to form a transparent conductive layer 130. Then, a low resistance metal material, for example, copper (Cu), copper alloy, aluminum (Al), or aluminum alloy (e.g., AlNd) is deposited on the transparent conductive layer 130 to form a third metal layer 131.

The third metal layer is coated with a photoresist to form a fourth photoresist layer (not shown). A light exposure is performed using a photo mask 199 including a transmissive region TA, a blocking region BA and a semi-transmissive region HTA, and a developing is performed. Accordingly, a fifth photoresist pattern 195a having a third thickness and a sixth photoresist pattern 195b having a fourth thickness greater than the third thickness are formed.

The fifth photoresist pattern 195a is formed corresponding to a portion where a pixel electrode (150 of FIG. 3Q) is formed, and a data pad portion DPA. The sixth photoresist pattern 195b is formed corresponding to a portion where source and drain electrodes (133 and 136 of FIG. 3P) are formed, and a boundary of the pixel region P, where a data line (not shown) is formed, crossing the gate line 123.

Figure 3N:
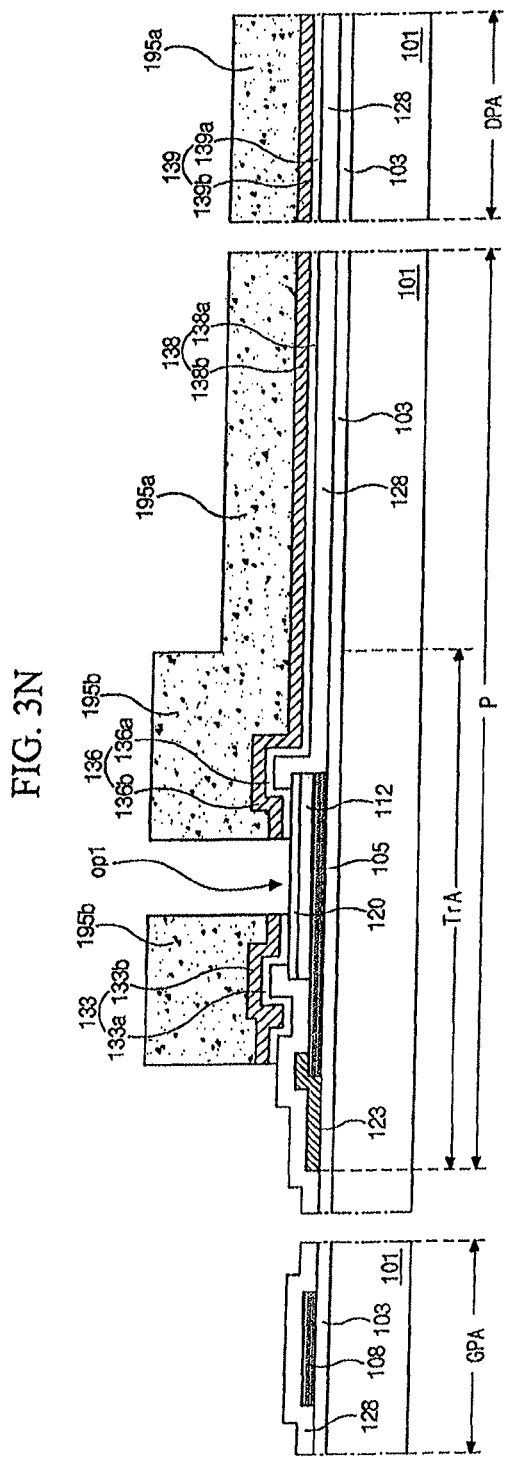

Referring to FIG. 3N, the third metal layer 131 is etched using the fifth and sixth photoresist patterns 195a and 195b, and then the transparent conductive layer 130 exposed by removing the third metal layer is etched. Accordingly, source and drain electrodes 133 and 136, which are spaced apart from each other, have double-layered structures of lower layers 133a and 136a made of transparent conductive material and upper layers 133b and 136b of low resistance metal material, and contact the oxide semiconductor layer exposed through the first opening op1, are formed. In the same process, the data line having a double-layered structure and connected to the source electrode 133 is formed at the boundary of the pixel region crossing the gate line 123.

At the data pad portion DPA, a pad pattern 139 having a double-layered structure of a lower layer 139a made of transparent conductive material and an upper layer 139b made of low resistance metal material is formed. In the pixel region P, a pixel pattern 138 having a double-layered structure of a lower layer 138a made of transparent conductive material and an upper layer 138b made of low resistance metal material is formed Referring to FIG. 3O, an ashing is performed to remove the fifth photoresist pattern 195a having the third thickness, and the upper layer 138b of the pixel pattern 138 and the upper pattern 139b of the pad pattern 139 are exposed.

The sixth photoresist pattern 195b is reduced in thickness by the ashing and remains on the source and drain electrodes 133 and 136 and the data line.

Referring to FIG. 3P, the upper layer 138b of the pixel pattern 138 and the upper pattern 139b of the pad pattern 139 is etched to form a pixel electrode 150, which extends from the drain electrode 136 and is made of transparent conductive material, and a data pad electrode 153 that is connected to the data line and is made of transparent conductive material.

The gate electrode 105, the gate insulating layer 112, the oxide semiconductor layer 120, the inter-layered insulating film 128, and the source and drain electrodes 133 and 136 sequentially laminated in the switching region TrA form a switching thin film transistor Tr.

Even though not shown in the drawings, when the array substrate is used for an OLED, a power line may be formed in parallel with the data line in the process of forming the data line.

Further, a driving region may be further defined, and a driving thin film transistor, which is connected to the switching thin film transistor Tr and has the same structure as the switching thin film transistor Tr, may be formed in the driving region. The driving thin film transistor may be formed in the same process of forming the switching thin film transistor. In this case, the pixel electrode 150 may be connected to the drain electrode of the driving thin film transistor and function as an electrode of an organic light emitting diode, and the drain electrode 136 may be connected to a gate electrode of the driving thin film transistor.

Referring to FIG. 3Q, a stripping is performed to remove the sixth photoresist pattern 195, and the data line and the source and drain electrodes 133 and 136 are exposed.

Then, an inorganic insulating material, for example, silicon oxide ($SiO_2$) or silicon nitride (SiNx) is deposited entirely on the pixel electrode 150 to form a passivation layer 140.

Then, the passivation layer 140 is patterned in a mask process to form a second opening opt exposing the pixel electrode 150 and a data pad hole 144 exposing the data pad electrode 153. Further, in this process, the passivation layer 140 and the inter-layered insulating layer 128 are patterned to form a gate pad hole 143 exposing the gate pad electrode 108.

According to the method of the embodiment, a metal layer made of metal material which has a high melting point and is hardly deformed even when exposed to a high temperature of about 300 degrees Celsius or more, and an oxide semiconductor material layer are formed on the metal layer, then a heat-treatment is performed, then the metal layer and the oxide semiconductor layer are patterned in the same mask process to form a gate electrode and an oxide semiconductor layer, and then a gate line made of low resistance metal material and connected to the gate electrode is formed. Accordingly, the gate line is not deformed, and misalignment and reduction of production rate due to deformation can be prevented. Therefore, the oxide semiconductor layer having high mobility and high reliability and the gate line having low resistance as well can be formed, and signal delay can be prevented even with an array substrate large-sized.

Further, the array substrate is fabricated with 5 mask processes, which is reduced by one mask process less than the related art with 6 mask processes. Accordingly, fabrication is simplified, and production cost and time can be reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed:

1. An array substrate comprising:
    a gate electrode in a switching region of a pixel region on a substrate and having an island shape;
    a gate insulating layer and an oxide semiconductor layer which are disposed sequentially on the gate electrode, expose an end part of the gate electrode, and have the same plane area;
    a gate line contacting the end part of the gate electrode that is exposed outside the oxide semiconductor layer and disposed on the substrate;
    an inter-layered insulating film disposed above the gate line and having a first opening that exposes a center portion of the oxide semiconductor layer;
    source and drain electrodes and a data line on the inter-layered insulating film and having a double-layered structure of a lower layer made of transparent conductive material and an upper layer of low resistance metal material, wherein the data line crosses the gate line, wherein the source and drain electrodes contact the center portion of the oxide semiconductor layer in the same first opening of the inter-layered insulating film and are spaced apart from each other;

a pixel electrode in the pixel region on the inter-layered insulating film and extending from the lower layer of the drain electrode; and a passivation layer on the pixel electrode and having a second opening exposing the pixel electrode.

2. The substrate according to claim 1, wherein the gate electrode is made of one of molybdenum (Mo), titanium (Ti), or molybdenum titanium (MoTi).

3. The substrate according to claim 1, wherein the low resistance material is copper (Cu), copper alloy, aluminum (Al), or aluminum alloy, and the transparent conductive material is indium-tin-oxide (ITO), or indium-zinc-oxide (IZO).

4. The substrate according to claim 1, further comprising a buffer layer made of inorganic insulating material between the gate electrode and the substrate.

5. The substrate according to claim 1, further comprising:

a gate pad electrode formed at the same layer as and of the same material as the gate electrode, and connected to an end of the gate line; and a data pad electrode formed at the same layer as and of the same material as the pixel electrode, and connected to an end of the data line.

6. The substrate according to claim 1, wherein the source and drain electrodes each have a first portion disposed above the inter-layered insulating film and a second portion disposed in the first opening, both the second portions of the source and drain electrodes being disposed in the same first opening and being spaced apart in the same first opening.

* * * * *